United States Patent [19]

Yamauchi

[11] Patent Number: 5,691,955
[45] Date of Patent: Nov. 25, 1997

[54] SYNCHRONOUS SEMICONDUCTOR MEMORY DEVICE OPERATING IN SYNCHRONIZATION WITH EXTERNAL CLOCK SIGNAL

[75] Inventor: Tadaaki Yamauchi, Hyogo, Japan

[73] Assignee: Mitsubishi Denki Kabushiki Kaisha, Tokyo, Japan

[21] Appl. No.: 652,048

[22] Filed: May 23, 1996

[30] Foreign Application Priority Data

Sep. 5, 1995 [JP] Japan ................. 7-227996

[51] Int. Cl.$^6$ ......................... G11C 7/00
[52] U.S. Cl. ............... 365/233; 365/230.03; 365/230.08; 365/236
[58] Field of Search .................. 365/233, 236, 365/230.03, 230.08

[56] References Cited

U.S. PATENT DOCUMENTS

| 4,773,049 | 9/1988 | Takemae | 365/233 |
| 5,274,596 | 12/1993 | Watanabe | 365/233 |
| 5,384,745 | 1/1995 | Konishi et al. | 365/230.03 |
| 5,539,696 | 7/1996 | Patel | 365/233 |

OTHER PUBLICATIONS

Yunho Choi et al, 16Mbit Synchronous DRAM with 125Mbyte/sec Data Rate, VSLI Circuit Symposium 1993, pp. 65–66.

*Primary Examiner*—David C. Nelms
*Assistant Examiner*—Michael T. Tran
*Attorney, Agent, or Firm*—Lowe, Price, LeBlanc & Becker

[57] ABSTRACT

A synchronous semiconductor memory device according to the present invention is provided with two column address counters corresponding to two banks. The two column address counters receives two reference internal column address signals output from the two column address buffers. Each of the column address counters outputs internal column address signals successively and alternately according to the reference internal column address signals. As a result, when the access is to be performed alternately to the two banks, it would not be necessary to input an external column address signal each time the bank to be accessed changes, so that it is made possible to simplify the address input.

18 Claims, 13 Drawing Sheets

SYNCHRONOUS SEMICONDUCTOR MEMORY DEVICE OPERATING IN SYNCHRONIZATION WITH EXTERNAL CLOCK SIGNAL

BACKGROUND OF THE INVENTION

1. Field of the Invention

The present invention relates to a synchronous semiconductor memory device having a plurality of memory array banks, and particularly to a synchronous semiconductor memory device in which input of the addresses can be simplified.

2. Description of the Background Art

FIG. 13 is a schematic block diagram showing a conventional synchronous semiconductor memory device.

Referring to FIG. 13, an address buffer 3 receives an external address signal Add. The external column address signal provided as external address signal Add is input to a column address counter 91 as a reference internal column address signal via a column address buffer 89.

Column address counter 91 uses the reference internal column address signal from column address buffer 89 as the starting address which is incremented (to be internal column address signals) and generated successively.

Then, according to an internal row address signal from a row address buffer A21 and the internal column address signal from column address counter 91, one memory cell within a memory array bank A41 is selected. Similarly, as for a memory array bank B43, one memory cell in memory array bank B43 is selected according to an internal row address signal from a row address buffer B23 and the internal column address signal from column address counter 91.

In this way, memory cells in the memory array banks are selected to perform read or write operations.

FIG. 14 is a timing chart for illustrating the operation of the conventional synchronous semiconductor memory device shown in FIG. 13.

Description is made with reference to FIGS. 13 and 14. There is only one column address counter 91 for successively generating internal column address signals in the conventional synchronous semiconductor memory device. Therefore, it is not possible to hold a plurality of starting addresses (that is, a plurality of reference internal column address signals). Accordingly, there has been a problem as described below when access is to be made alternately to memory array bank A41 and memory array bank B43.

The problem was that it was necessary to input external column address signals (Ya0, Ya1, Ya2, Ya3) to memory array bank A41 and external column address signals (Yb0, Yb1, Yb2, Yb3) to memory array bank B43 alternately, meaning that input of an external column address signal is required upon every change of the memory array bank which is to be accessed.

In addition, there has been a similar problem also when access is to be made alternately with two different starting addresses (that is, different reference internal column address signals) to one single memory array bank among the two memory array banks. More specifically, when access was to be made successively to the addresses obtained by incrementing each one of the two starting addresses, it was necessary to input an external column address signal upon every change of access so that a starting address (reference internal column address signal) would be input.

SUMMARY OF THE INVENTION

The present invention has been made to solve the problems as described above, by providing a synchronous semiconductor memory device in which there is no need to input an external column address signal upon each access when a plurality of starting addresses (that is, a plurality of reference internal column address signals) are employed to perform alternating accesses to data in succession. In other words, the present invention provides a synchronous semiconductor memory device in which input of addresses can be simplified.

A synchronous semiconductor memory device according to the present invention includes an internal clock signal generating circuit, a plurality of memory array banks, a row address buffer, a column address buffer and a plurality of address counter circuits.

The internal clock signal generating circuit generates an internal clock signal according to an external clock signal. The memory array bank has a plurality of memory cells for storing information. The row address buffer receives a plurality of external row address signals for selecting a corresponding row of the corresponding memory array bank, and in response to these signals, generates a plurality of internal row address signals.

The column address buffer receives a plurality of external column address signals for selecting a corresponding column of the corresponding memory array bank, and in response to these signals, generates a plurality of reference internal column address signals. The address counter circuit successively generates internal column address signals for selecting the columns of the memory arrays bank according to the reference internal column address signal from the column address buffer, in synchronization with the internal clock signal.

As has been described above, in a synchronous semiconductor memory device according to the present invention, a plurality of address counter circuits are provided, and a plurality of reference internal column address signals can be allocated to these address counter circuits. Accordingly, the plurality of address counter circuits can generate a plurality of internal column address signals successively and alternately based on the plurality of reference internal column address signals.

As a result, in the synchronous semiconductor memory device according to the present invention, it is not necessary to input a corresponding external column address signal upon each access, and thus address input can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A synchronous dynamic random access memory (hereinafter referred to as "SDRAM") provided as a synchronous semiconductor memory device in accordance with the present invention will now be described in the following, with reference to the figures.

Embodiment 1

Figure 1:
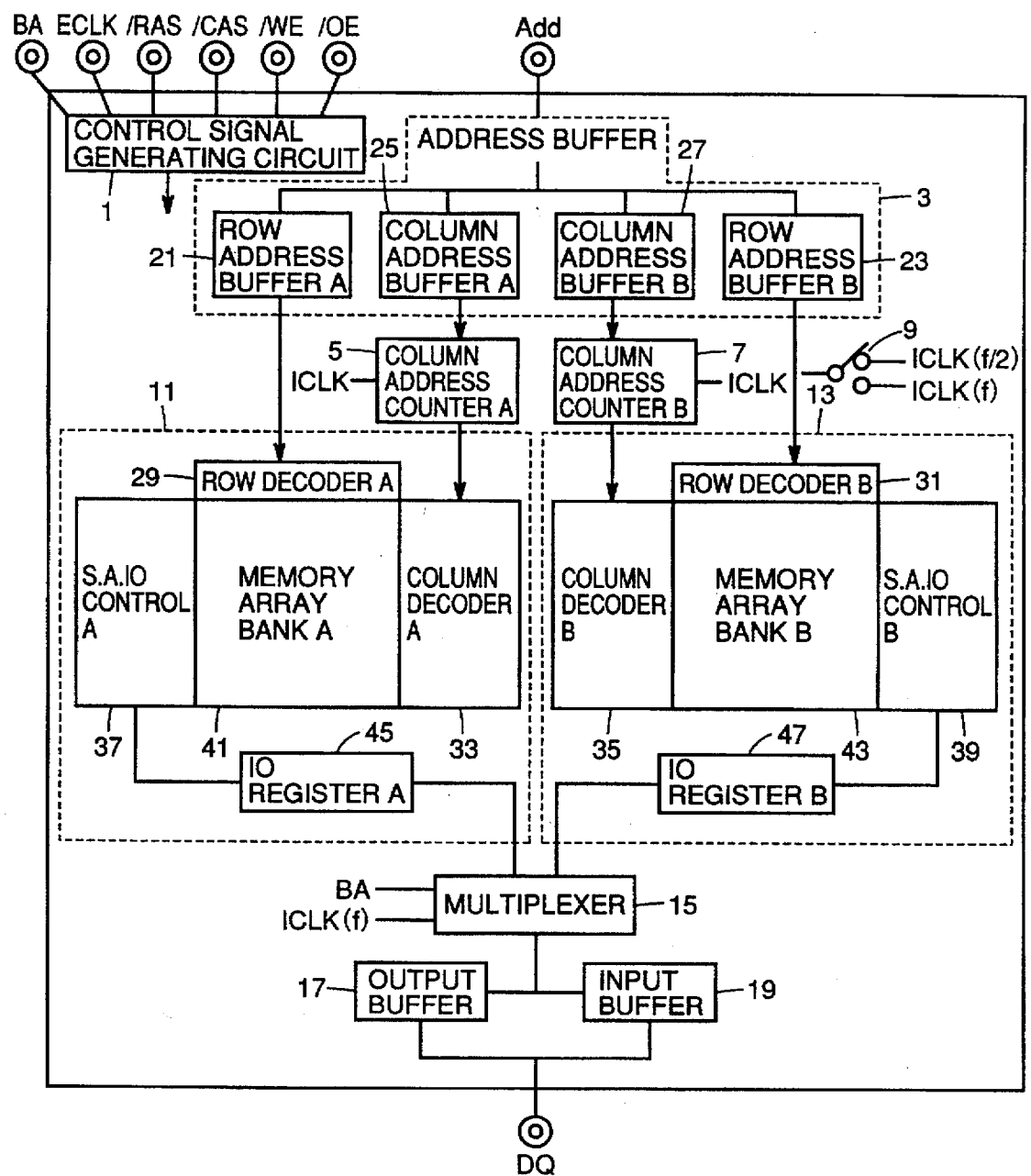
FIG. 1 is a schematic block diagram showing an SDRAM according to Embodiment 1 of the present invention.

FIG. 1 is a schematic block diagram showing an SDRAM according to Embodiment 1 of the present invention.

Referring to FIG. 1, the SDRAM according to Embodiment 1 is provided with a control signal generating circuit 1, an address buffer 3, a column address counter A5, a column address counter B7, a switching circuit 9, a bank A11, a bank B13, a multiplexer 15, an output buffer 17 and an input buffer 19.

Address buffer 3 includes a row address buffer A21, a row address buffer B23, a column address buffer A25 and a column address B27. Bank A11 includes a row decoder A29, a column decoder A33, a sense amplifier input/output control circuit A (S.A. IO control circuit A) 37, a memory array bank A41 and an IO register A45. Bank B13 includes a column decoder B35, a row decoder B31, a sense amplifier input/output control circuit B (S.A. IO control circuit B) 39, a memory array bank B43 and an IO register B47.

Control signal generating circuit 1 receives a bank address signal BA for selecting a bank, an external clock signal ECLK with a frequency f, a row address strobe signal /RAS (hereinafter referred to as "/RAS"), a column address strobe signal /CAS (hereinafter referred to as "/CAS"), a write control signal /WE and a read output control signal /OE.

Since bank A11 and bank B13 are of an identical structure, description will be made for the portion relating to bank A11 only. Address buffer 3 receives an external address signal Add. That is, row address buffer A21 receives an external row address signal for selecting a row of memory array bank A41. Column address buffer A25 receives an external column address signal for selecting a column of memory array bank A41.

Control signal generating circuit 1 receives external clock signal ECLK, and according to this clock signal, generates an internal clock signal ICLK (f) having a frequency f which is the same as that of external clock signal ECLK. In addition, control signal generating circuit 1 generates an internal clock signal ICLK (f/2) having a frequency f/2 which is a value obtained by dividing the frequency f of external clock signal ECLK into ½, according to external clock signal ECLK.

Column address counter A5 receives an external column address signal through column address buffer A25. More specifically, column address counter A5 receives a reference internal column address signal for selecting a column of memory array bank A41 from column address buffer A25.

Column address counter A5 operates in synchronization with an internal clock signal ICLK of frequency f or f/2. More particularly, column address counter A5 successively generates internal column address signals for selecting the columns of memory array bank A41 according to the reference internal column address signal, in synchronization with clock signal ICLK.

In further detail, column address counter A5 employs the reference internal column address signal from column address buffer A25 as the starting address, and successively generates the addresses obtained by incrementing the starting address as internal column address signals. Switching between internal clock signal ICLK (f) with frequency f and internal clock signal ICLK (f/2) with frequency f/2 is performed by switching circuit 9.

Memory array bank A41 has a plurality of memory cells not shown. These memory cells are for storing information. Row decoder A29 receives an external row address signal through row address buffer A21. That is, row decoder A29 receives an internal row address signal for selecting a row of memory array bank A41, from row address buffer A21. Row decoder A29 selects a row of memory array bank A41 according to the internal row address signal.

Column decoder A33 receives the internal column address signal generated from column address counter A5. Column decoder A33 successively selects the columns of memory array bank A41 according to the successively generated internal column address signals. The sense amplifier not shown, which is included in sense amplifier input/output control circuit A37, amplifies the potential difference read out to the bit line pair of memory array bank A41. An input/output control circuit not shown, which is included in sense amplifier input/output control circuit A37, controls transmission and reception of data by memory array bank A41. IO register A45 temporarily holds the input/output data.

Multiplexer 15 selects a bank according to a bank address signal BA for selecting the bank. When bank A11 is selected, for example, multiplexer 15 inputs a write data from input buffer 19 to bank A11. Also, when bank A11 is selected, for example, multiplexer 15 inputs a readout data from IO register A45 to output buffer 17. Multiplexer 15 operates in synchronization with internal clock signal ICLK (f) having the frequency f.

Figure 13:
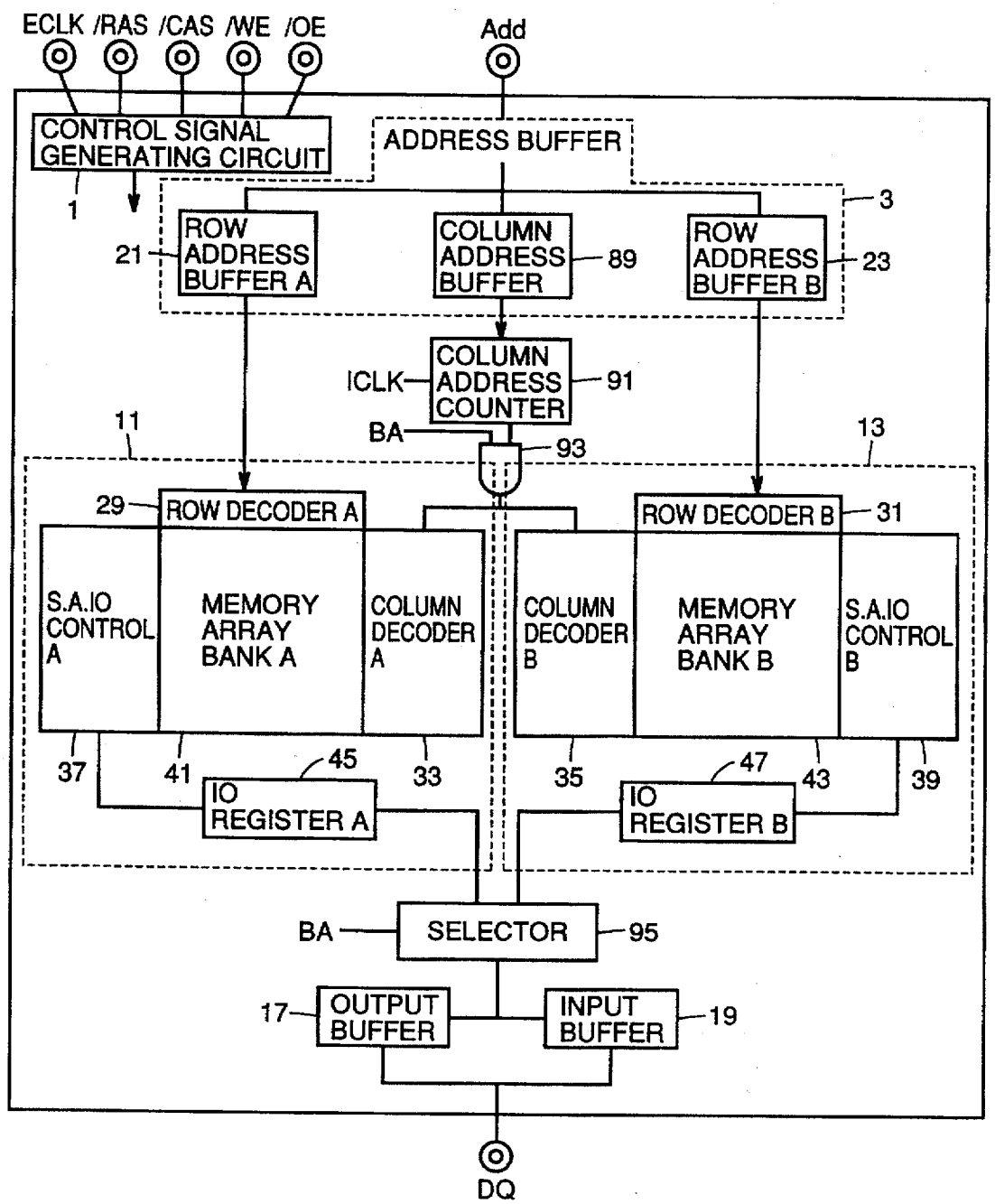
FIG. 13 is a schematic block diagram showing a conventional SDRAM.
Figure 14:
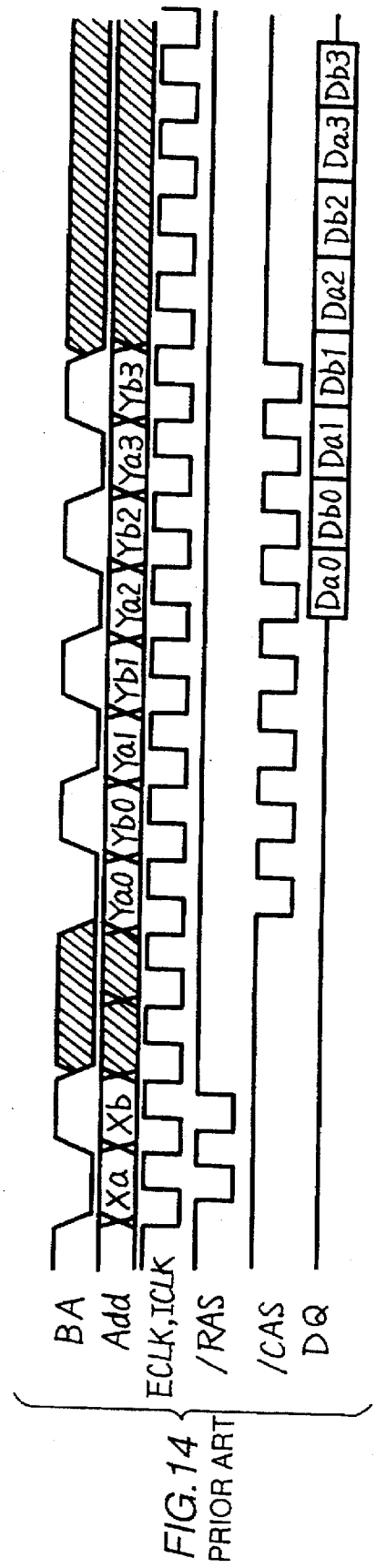
FIG. 14 is a timing chart for illustrating the operation of SDRAM in FIG. 13.

Input buffer 19 receives data DQ, which is input to multiplexer 15 as a write data. Output buffer 17 outputs the readout data from multiplexer 15 as data DQ. In the case where SDRAM of FIG. 1 operates similarly to SDRAM of FIG. 13, column address counter A5 and column address counter B7 are brought into synchronization with internal clock signal ICLK (f) of frequency f. As will be described in the following, when SDRAM of FIG. 1 operates as in the present embodiment, operations of column address counter A5 and column address counter B7 are in synchronization with internal clock signal ICLK (f/2) of frequency f/2.

Figure 2:
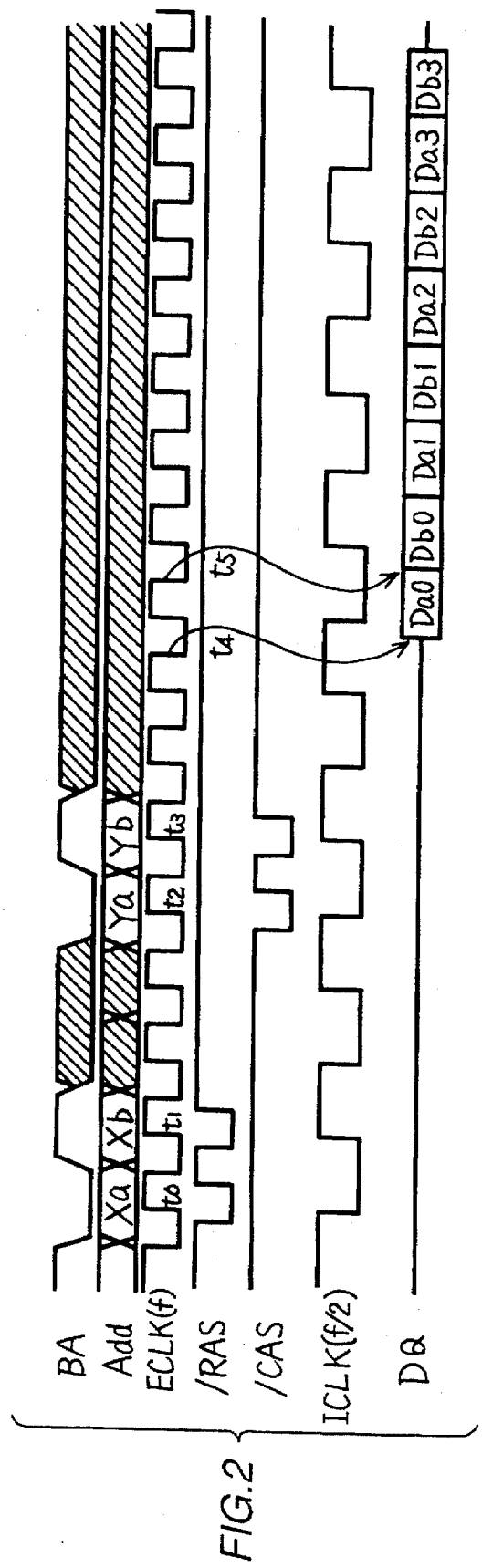
FIGS. 2 to 4 are timing charts for illustrating the first to third operations of the SDRAM in FIG. 1.

FIG. 2 is a timing chart for illustrating the first operation of SDRAM of FIG. 1.

In the first operation, external signals such as bank address signal BA, external address signal Add, /RAS, /CAS, write control signal /WE and read output control signal /OE are incorporated at the rising edge of external clock signal ECLK.

At the rising edge of external clock signal ECLK at time $t_0$, bank address signal BA at "L" level, external row address signal Xa (hereinafter simply referred to as "row address signal" without making distinction between external and internal row address signals), and /RAS are incorporated. When bank address signal BA is at "L" level, it indicates that bank A11 is selected.

Thus, at time $t_0$, memory array bank A41 having its row selected by row decoder A29 according to row address signal Xa to bank A11 from row address buffer A21 starts operating.

At the rising edge of internal clock signal ECLK at time $t_1$, bank address signal BA at "H" level, row address signal Xb to bank B13 and /RAS are incorporated. When bank address signal BA is at "H" level, it indicates that bank B13 is selected. Thus, at time $t_1$, memory array bank B43 having its row selected by row decoder B31 according to row address signal Xb to bank B13 from row address buffer B23 starts operating.

At the rising edge of external clock signal ECLK at time $t_2$, bank address signal BA at "L" level indicating bank A11, external column address signal Ya to bank A11 (hereinafter simply referred to as "column address signal" when there is no need to make distinction between external column address signal and reference internal column address signal upon description thereof), and /CAS are incorporated.

Thus, column address buffer A25 receives external column address signal Ya, which is output as reference internal column address signal Ya. Column address counter A5 successively generates internal address signals employing the output from column address buffer A25 as the reference (that is, employing reference internal column address signal Ya as the starting address). The successively generated internal column address signals from column address counter A5 are input to column decoder A33, to successively select the columns of memory array bank A41.

At the rising edge of external clock signal ECLK at time $t_3$, bank address signal BA at "H" level indicating bank B13, external column address signal Yb to bank B13 and /CAS are incorporated. Thus, column address buffer B27 receives external column address signal Yb to bank B13 which is output as reference internal column address signal Yb. Column address counter B7 successively generates internal column address signals to bank B13, employing the output from column address buffer B27 as the reference (that is, employing reference internal column address signal Yb as the starting address). Column decoder B35 receives the successively generated internal column address signals from column address counter B7 and successively selects the columns of memory array bank B43.

From the falling edge of external clock signal ECLK at time $t_4$, data Da0 corresponding to row address signal Xa and column address signal Ya are output. The condition for time $t_4$ is that the output of data after time $t_0$ is performed after row address access time (/RAS access time) has expired after time $t_0$ or column address access time (/CAS access time) has expired after time $t_2$.

From the falling edge of external clock signal ECLK at time $t_5$, data Db0 corresponding to row address signal Xb and column address signal Yb are output.

Thereafter, employing reference internal column address signals Ya and Yb as the reference, (that is, as the starting addresses), data (Da1, Da2, Da3) of bank A11 and data (Db1, Db2, Db3) of bank B13 are output alternately according to internal column address signals output from column address counter A5 and column address counter B7, respectively.

This is based upon the fact that column address counter A5 and column address counter B7 are successively generating internal address signals according to reference internal column address signal Ya and internal column address signals according to reference internal column address signal Yb, respectively, in synchronization with internal clock signal ICLK (f/2) of frequency f/2. Column address counter A5 successively generates internal column address signals in correspondence to the falling edge of internal clock signal ICLK (f/2). Column address counter B7 successively generates internal column address signals in correspondence to the rising edge of internal clock signal ICLK (f/2).

Here, incorporation of external signals such as external address signal Add to bank A11 and /RAS is performed at an even-numbered clock of external clock signal ECLK, assuming that the clock of time $t_0$ is the 0th clock. Also, output of data to bank A11 must be performed before the rise of an even-numbered clock. It is similar with the case of bank B13, assuming that the clock at time $t_1$ is the 0th clock.

Thus, in this embodiment, column address counter A5 and column counter B7 are provided corresponding to bank A11 and bank B13. Accordingly, reference internal address signal to bank A11 and reference internal address signal to bank B13 can be held at column address counter A5 and column address counter B7, respectively. Therefore, column address counter A5 and column address counter B7 can successively and alternately generate internal address signals according to reference internal column address signal to bank A11 and internal column address signals according to reference internal column address signal to bank B13, respectively.

As a result, in the present embodiment, it is not necessary to input the external column address signal to the bank to be accessed upon each change of the bank to be accessed, even when bank A11 and bank B13 are accessed alternately to read out the data alternately. In other words, address input can be simplified.

Figure 3:
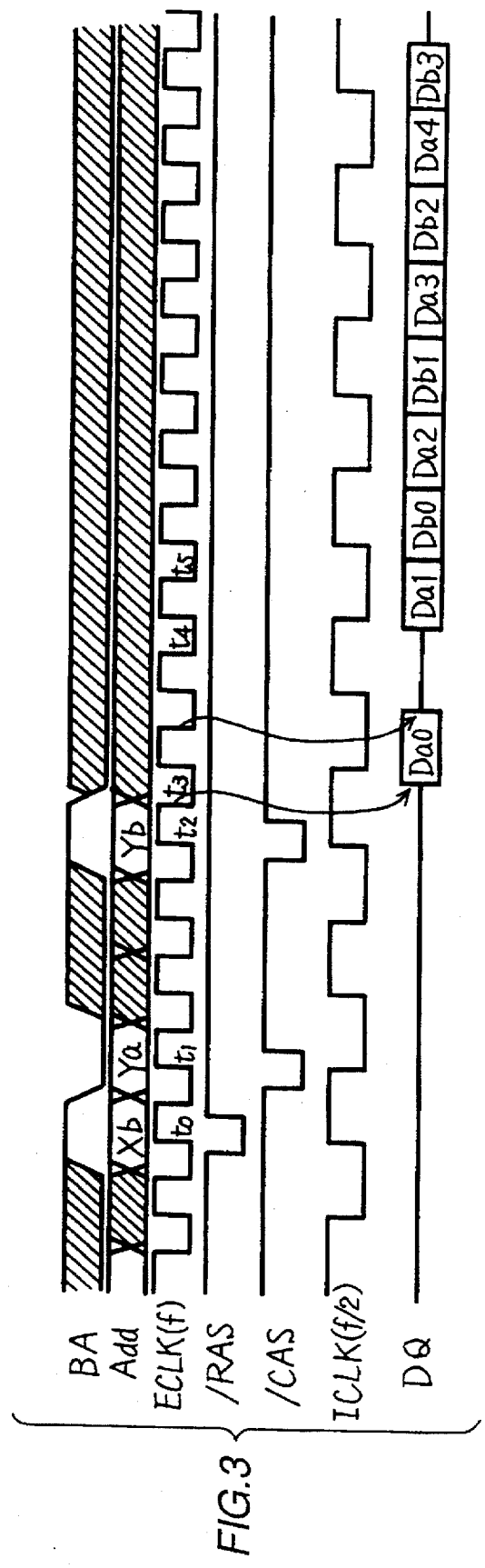

FIG. 3 is a timing chart for illustrating the second operation of SDRAM of FIG. 1. In the second operation of the SDRAM of FIG. 1, /RAS to bank A11 has been already incorporated.

Referring to FIG. 3, at the rising edge of external clock signal ECLK at time $t_0$, a bank address signal BA at "H" level indicating bank B13, /RAS and row address signal Xb to bank B13 are incorporated.

At time $t_1$, a bank address signal BA at "L" level indicating bank A11, /CAS, and column address signal Ya to bank B13 are incorporated. Here, as for bank A11, /RAS is already incorporated and row-related circuitry is activated.

Accordingly, from the falling edge of external clock signal at time $t_3$ which satisfies the condition that the time period between $t_1$ and the output of data reaches the column address access time (/CAS access time), data Da0 to bank A11 is output. Then, at the next falling edge of external clock signal ECLK, output of data is finished. Data Da0 corresponds to column address signal Ya.

Column address counter A5 employs reference internal column address signal Ya as the starting address, and successively generates the addresses obtained by incrementing that starting address as internal column address signals.

Therefore, at time $t_4$ which comes after skipping one clock of external clock signal ECLK from the time of output of data Da0, output of a readout data Da1 for the internal column address signal following the internal column address signal which corresponds to column address signal Ya (that is, internal column address signal obtained by incrementing reference internal column address signal Ya by one stage) from column address counter A5 is started.

Meanwhile, as for bank B13, /RAS is incorporated at time $t_0$ and /CAS is incorporated at time $t_2$. Until the output of accessed data Db0 to bank B13, data of bank A11 is output upon every other clock of external clock signal ECLK. In addition, data to bank B13 is output from a time which satisfies the row address access time (/RAS access time) to bank B13 or column address access time (/CAS access time).

In FIG. 3, data Db0 to bank B13 is output in continuation to data Da1 to bank A11. In other words, output of data Da1 starts at time $t_4$ and output of data Db0 starts at time $t_5$. Thereafter, data to bank A11 (Da2, Da3, Da4) and data to bank B13 (Db1, Db2, Db3) are output alternately.

This is based upon the fact that column address counter A5 and column address counter B7 generate internal address signals according to reference internal column address signal Ya and internal column address signals according to reference internal column address signal Yb successively and alternately in synchronization with internal clock signal ICLK (f/2) of frequency f/2.

Column address counter A5 generates the internal column address signal in response to the falling edge of internal clock signal ICLK (f/2). Column address counter B7 generates internal column address signal in response to the rising edge of internal clock signal ICLK (f/2).

Thus, for the same reason provided in the description of the first operation, it is not necessary to input the external column address signal to the bank to be accessed upon each change of the bank to be accessed, also in the case in which the SDRAM of FIG. 1 performs a second operation. In other words, address input can be simplified also in the case in which SDRAM of FIG. 1 performs a second operation.

Figure 4:
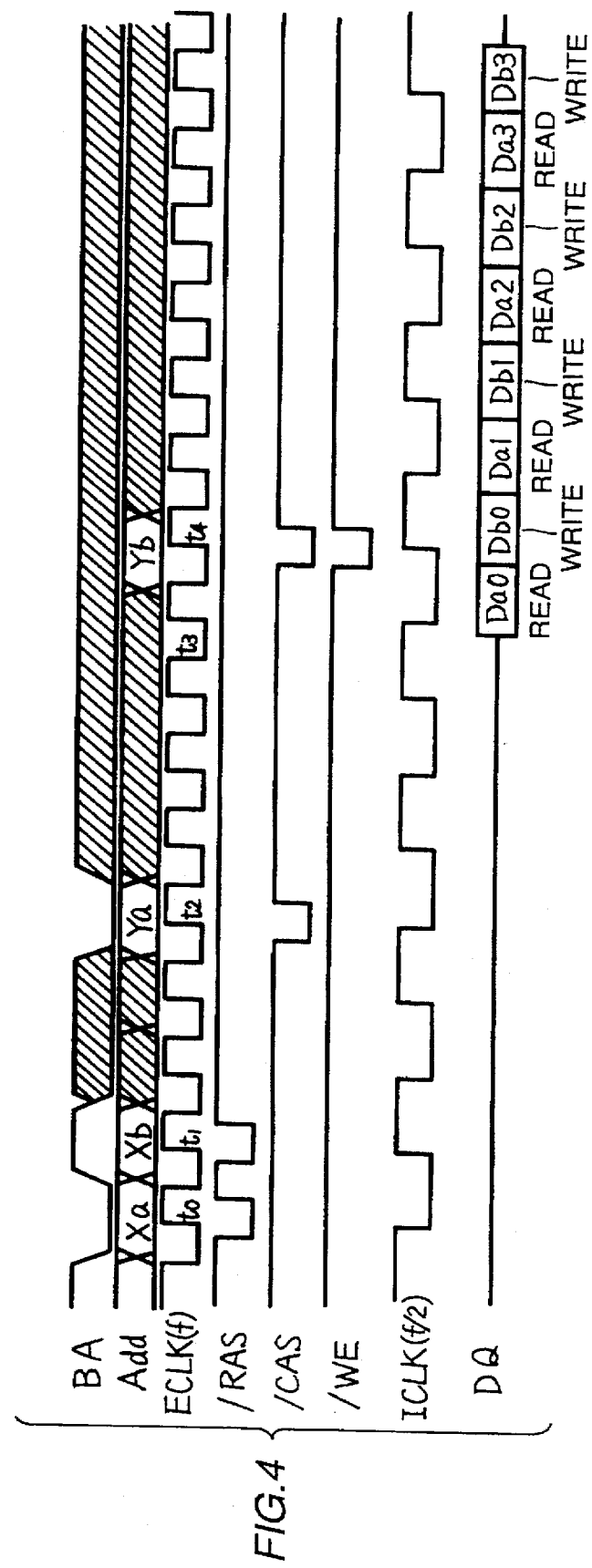

FIG. 4 is a timing chart for illustrating a third operation of the SDRAM of FIG. 1. In the third operation, read operation and write operation are executed alternately by bank A11 and bank B13.

Referring to FIG. 4, row address Xa to bank A11, /RAS and a bank address signal BA at "L" level indicating bank A11 are incorporated at time $t_0$.

A row address Xb to bank B13, /RAS and a bank address signal BA at "H" level indicating bank B13 are incorporated at time $t_1$.

Column address signal Ya to bank A11 is incorporated at time $t_2$. Then, at time $t_3$, output of data Da0 to bank A11 starts from the falling edge of external clock signal ECLK.

Meanwhile, at time $t_4$, /CAS to bank B13, write control signal /WE, column address signal Yb and write data Db0 are incorporated at the rising edge of external clock signal ECLK.

Thereafter, readout data (Da1, Da2, Da3) to bank A11 and write data (Db1, Db2, Db3) to bank B13 are input/output alternately. This is based on the fact that column address counter A5 and column address counter B7 employs reference internal column address signals Ya and Yb as the starting addresses, respectively, and successively generates internal column address signals to bank A11 and internal column address signals to bank B13 in synchronization with internal clock signal ICLK (f/2).

Column address counter A5 generates internal column address signal in response to the falling edge of internal clock signal ICLK (f/2). Column address counter B7 generates the internal column address signal in response to the rising edge of internal clock signal ICLK (f/2).

Thus, for the reason similar to the reason provided in the description of the first operation, it is not necessary to input an external column address signal to the bank to be accessed upon every change of the bank to be accessed, also in the case in which the SDRAM of FIG. 1 performs the third operation. In other words, address input can also be simplified in the case in which the SDRAM of FIG. 1 performs the third operation.

Although the case in which there are two banks was shown in FIG. 1, a similar effect as described above can be obtained even when there are a plurality of banks more than two, by providing a plurality of column address counters to the plurality of banks so that application can be made similarly to the case described above.

Embodiment 2

Figure 5:
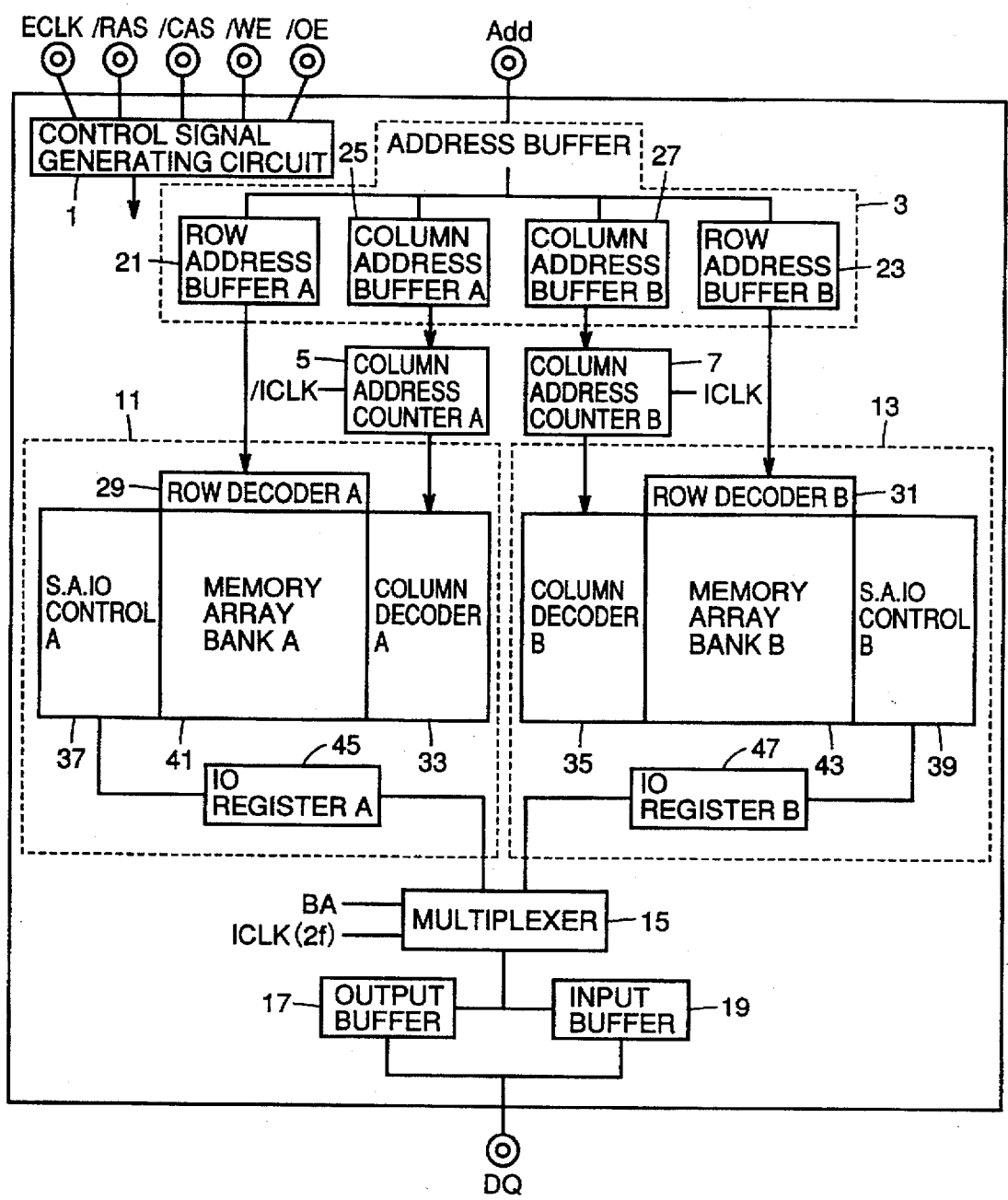
FIG. 5 is a schematic block diagram showing an SDRAM according to Embodiment 2 of the present invention.

FIG. 5 is a schematic block diagram showing an SDRAM according to Embodiment 2 of the present invention. The portions similar to those of FIG. 1 are denoted by identical reference characters, and description thereof is not given, in an appropriate manner.

Difference between the SDRAM of FIG. 5 and the SDRAM of FIG. 1 is as follows. The SDRAM of FIG. 5 differs from that of FIG. 1 in that frequency of external clock signal ECLK is identical to the frequency of internal clock signal ICLK to which a column address counter is synchronized. That is, frequencies of external clock signal ECLK and internal clock signal ICLK are of a value f. Also, one of column address counter A5 and column address counter B7 operates at the rise of internal clock signal ICLK (f) and the other operates at the fall of internal clock signal ICLK (f).

The difference also exists in that multiplexer 15 switches to one bank at the rise of internal clock signal ICLK (2f) having a frequency 2f which is a value obtained by doubling the value of frequency f of external clock signal ECLK, and is switched to the other bank at the fall of internal clock signal ICLK (2f) in the SDRAM of FIG. 5. Also, in a control signal generating circuit 1 of the SDRAM of FIG. 5, external signals such as external address signal Add, /RAS and /CAS are incorporated at both rise and fall of external clock signal ECLK.

Figure 6:
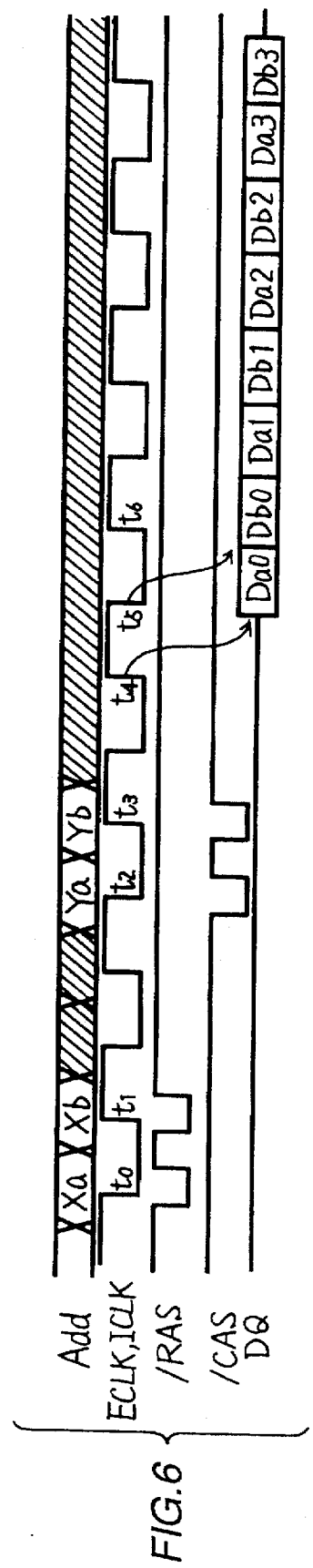
FIGS. 6 and 7 are timing charts for illustrating the first to second operations of the SDRAM in FIG. 5.

FIG. 6 is a timing chart for illustrating a first operation of the SDRAM of FIG. 5. In the first operation, external address signals Add (external row address signal, external column address signal) to bank A11 are incorporated at the fall of external clock signal ECLK, an output buffer 17 is activated from the rise of external clock signal ECLK, and output of the readout data is started. In addition, as for bank B13, external address signals Add (external row address signal, external column address signal) are incorporated at the rise of external clock signal ECLK, output buffer 17 is activated and output of the readout data is started from the fall of external clock signal ECLK.

Referring to FIG. 6, /RAS and a row address signal Xa to bank A11 are incorporated at the falling edge of external clock signal ECLK at time $t_0$. At time $t_1$, /RAS and a row address signal Xb to bank B13 are incorporated at the falling edge of external clock signal ECLK.

/CAS and a row address signal Ya to bank A11 are incorporated at the falling edge of external clock signal ECLK at time $t_2$. At time $t_3$, /CAS and a row address signal Yb to bank B13 are incorporated at the rising edge of external clock signal ECLK.

Assuming that the frequency f of external clock signal ECLK is 66 MHz in a memory with an /RAS access time of about 50 ns, output of data Da0 to bank A11 is started from time $t_4$ of the fall of external clock signal ECLK which comes after time $t_3$. The output is determined before the time $t_5$ of the fall of external clock signal ECLK.

At time $t_5$, switching is made to bank B13 from the falling edge of external clock signal ECLK, and output of data Db0 to bank B13 is started. Then, the data is determined before the rise of external clock signal ECLK at time $t_6$.

Thereafter, by a similar procedure, data (Da1, Da2, Da3) to bank A11 and data (Db1, Db2, Db3) to bank B13 are output alternately. This is based on the fact that column address counter A5 and column address counter B7 successively and alternately generate internal column address signals to bank A11 and internal column address signal to bank B13, respectively, in synchronization with internal clock signal ICLK (f) having the same frequency f as that of external clock signal ECLK.

More particularly, this is based upon the fact that column address counter A5 and column address counter B7 generate internal column address signals to bank A11 and internal column address signals to bank B13 successively and alternately by employing reference internal column address signals Ya and Yb as the starting addresses, respectively. Column address counter A5 generates the internal column address signal in response to the falling edge of internal clock signal ICLK (f). Column address counter B7 generates the internal column address signal in response to the rising edge of internal clock signal ICLK (f).

Thus, in the present embodiment, column address counter A5 and column address counter B7 are provided corresponding to bank A11 and bank B13. Accordingly, reference internal column address signal to bank A11 and reference internal column address signal to bank B13 can be held respectively at column address counter A5 and column address counter B7. Therefore, column address counter A5 and column address counter B7 can successively and alternately generate internal column address signals according to reference internal column address signal to bank A11 and reference internal column address signal to bank B13, respectively.

As a result, when bank A11 and bank B13 are to be accessed alternately in the present embodiment, it is not necessary to input an external column address signal to the bank to be accessed upon every change of the bank to be accessed. In other words, address input can be simplified in the present embodiment.

Figure 7:
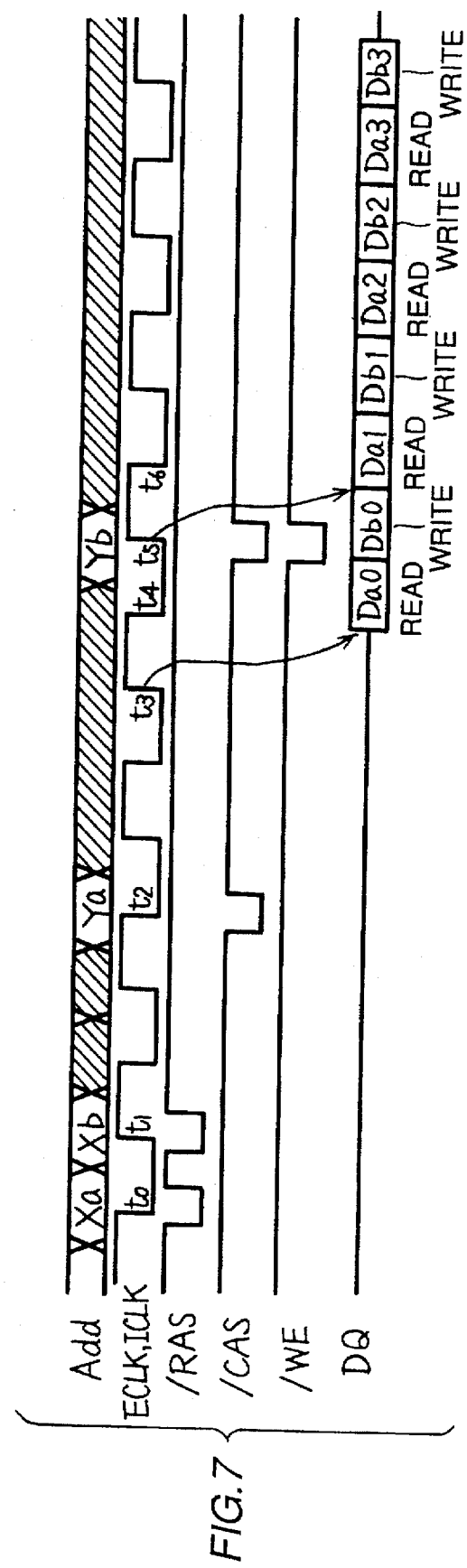

FIG. 7 is a timing chart for illustrating a second operation of the SDRAM of FIG. 5. In the second operation, external address signal Add to bank A11 is incorporated at the fall of external clock signal ECLK, output buffer 17 is activated from the rise of external clock signal ECLK, and output of readout data is started. In addition, in the second operation, external address signal Add and write data are incorporated at the rise of external clock signal ECLK to bank B13.

Referring to FIG. 7, /RAS and row address signal Xa to bank A11 are incorporated at time $t_0$. At time $t_1$, /RAS and row address signal Xb to bank B13 are incorporated. At time $t_2$, column address signal Ya to bank A11 and /CAS are incorporated.

At time $t_3$, output buffer 17 starts operating and output of data Da0 to bank A11 is started from the rising edge of external clock signal ECLK. At the falling edge of external clock signal ECLK at time $t_4$, output of data Da0 to bank A11 is finished. Here, the timing of the output of data Da0 satisfies /RAS access time.

Meanwhile, at the rising edge of external clock signal ECLK at time $t_5$, write data Db0 to bank B13 and write control signal /WE are incorporated, and at the same time, output of data Da1 to bank A11 is started. Thereafter, in a similar manner, read operation to bank A11 and write operation to bank B13 are performed alternately upon every edge of external clock signal ECLK.

This is based upon the fact that column address counter A5 and column address counter B7 successively generate internal column address signals to bank A11 and internal column address signals to bank B13, respectively, in synchronization with internal clock signal ICLK (f) of frequency f. Column address counter A5 generates internal column address signal in response to the falling edge of internal clock signal ICLK (f). Column address counter B7 generates internal column address signal in response to the rising edge of internal clock signal ICLK (f).

Thus, for reasons similar to the reason provided in description of the first operation, it is not necessary to input an external column address signal corresponding to the bank to be accessed upon every change of the bank to be accessed, also in the case in which the SDRAM of FIG. 1 performs the second operation. In other words, address input can be simplified also in the case in which the DRAM of FIG. 5 performs the second operation.

Although there were two banks provided in FIG. 5, a similar effect as described above can be obtained also in the case where there are a plurality of banks, namely more than two banks, by providing a plurality of column address counters corresponding to the plurality of banks so that application can be made in a similar manner as described above.

In addition, when column address counter A5 of FIG. 5 operates in synchronization with a signal /ICLK which is an inversion of internal clock signal ICLK, it generates an internal column address signal in response to the rising edge of signal /ICLK. At this time, column address counter B7 operates in synchronization with internal clock signal ICLK, and generates an internal column address signal at the rising edge of internal clock signal ICLK.

Embodiment 3

An SDRAM according to Embodiment 3 has the same function as that of SDRAMs of Embodiments 1 and 2, and can implement read and write operations to a plurality of sets of external column address signals (reference internal address signals) with the same external row address signals within the same bank.

Figure 8:
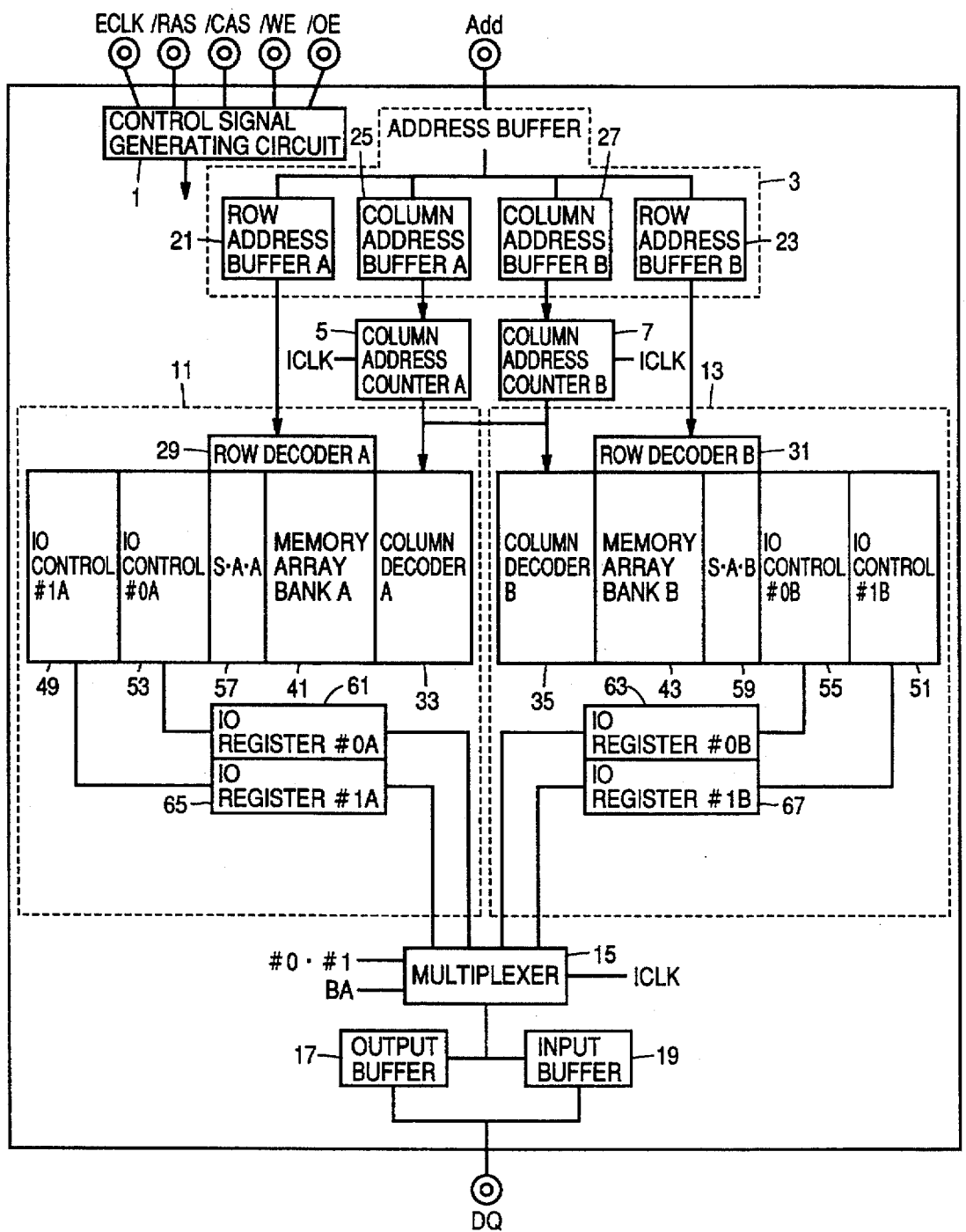
FIG. 8 is a schematic block diagram showing an SDRAM according to Embodiment 3 of the present invention.

FIG. 8 is a schematic block diagram showing an SDRAM according to Embodiment 3 of the present invention. The portions similar to those shown in FIG. 1 are denoted by identical reference characters and description thereof is not given, in an appropriate manner. The structure of SDRAM of FIG. 8 differs from that of the SDRAM of FIG. 1 mainly in the column address counter and the bank. Description will be made mainly for these different portions.

Referring to FIG. 8, a bank A11 includes a memory array bank A41, a row decoder A29, a column decoder A33, an input/output control circuit #1A (IO control circuit #1A) 49, an input/output control circuit #0A (IO control circuit #A) 53, a sense amplifier A (S.A.A) 57, an IO register #0A61 and an IO register #1A65. Since the structure of bank B13 is similar to the structure of bank A11, description thereof will not be provided here.

Column address counter A5 and column address counter B7 can employ bank A11 or bank B13 selectively. In other words, column address counter A5 and column address counter B7 can be utilized for bank A11. In addition, in a similar manner, column address counter A5 and column address counter B7 can be employed for bank B13 only. Usage similar to that of Embodiments 1 and 2 is also possible.

Sense amplifier A57 amplifies the potential difference read out to bit line pair not shown, of memory array bank A41. Here, consideration is made for the case in which column address counter A5 and column address counter B7 are employed for bank A11. Input/output control circuit #0A53 controls transmission and reception of data at a column of memory array bank A41 which is selected according to internal column address signal from column address counter A5. IO register #0A61 temporarily holds to the input/output data controlled by input/output control circuit #0A53.

Input/output control circuit #1A49 controls transmission and reception of data at a column of memory array bank A41 which is selected by an internal column address signal from column address counter B7. IO register #1A65 temporarily holds the input/output data controlled by input/output control circuit #1A49.

When a component corresponds to column address counter A5, it is denoted by "#0". When corresponding to column address counter B7, it is denoted by "#1".

Figure 9:
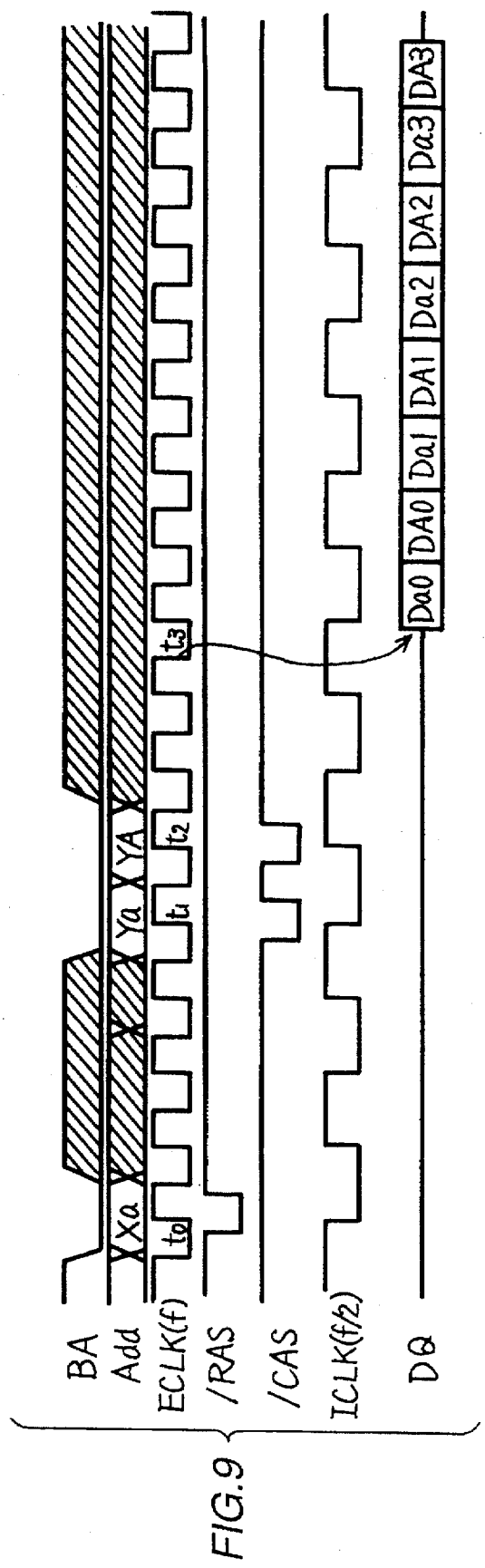
FIGS. 9 and 10 are timing charts for illustrating the first and second operations of the SDRAM in FIG. 8.

FIG. 9 is a timing chart for illustrating a first operation of the SDRAM in FIG. 8. In the first operation, column address counter A5 and column address counter B7 are used for bank A11 to alternately make accesses within bank A11 according to internal column address signals from the two column address counters.

In other words, in this first operation, reference internal column address signals Ya, YA are employed as the starting address at the same row address signal Xa of bank A11, and data for reference internal column address signal Ya and data for reference column address signal YA are output alternately.

Generation of internal column address signal according to reference internal column address signal Ya is performed by column address counter A5. Generation of internal column address signal according to reference internal column address signal YA is performed by column address counter B7.

Referring to FIG. 9, a row address signal Xa to bank A11 is incorporated at the rising edge of external clock signal ECLK having a frequency f at time $t_0$. At time $t_1$, column address signal Ya is incorporated at the rising edge of external clock signal ECLK. At time $t_2$, column address signal YA is incorporated at the rising edge of external clock signal ECLK.

Data Da0 to column address signal Ya is read out from the falling edge of external clock signal ECLK at time $t_3$. Then, data DA0 for column address signal Ya is read out. The time period between time $t_0$ and the time when data Da0 is output from the falling edge of external clock signal ECLK at time $t_3$ satisfies /RAS access time.

Thereafter, data (Da1, Da2, Da3) corresponding to internal column address signal according to reference internal column address signal Ya and data (DA1, DA2, DA3) corresponding to internal column address signals according to reference internal column address signal YA are output alternately.

This is based on the fact that column address counter A5 and column address counter B7 generate internal address signals according to reference internal column address signal Ya and internal column address signals according to reference internal column address signal YA, respectively, in synchronization with internal clock signal ICLK (f/2) with a frequency f/2 successively and alternately.

Column address counter A5 generates internal column address signals in response to the falling edge of internal clock signal ICLK (f/2). Column address counter B7 generates internal column address signals in response to the rising edge of internal clock signal ICLK (f/2).

Among the data read out to sense amplifier A57, the data selected at column selecting line is read out from input/output control circuit #0A53 in response to internal column address signal according to reference internal column address signal Ya. In addition, among the data read out to sense amplifier A57, the data selected at column selecting line is read out from input/output control circuit #1A49 in response to internal column address signal according to reference internal column address signal YA.

Multiplexer 15 alternately switches between the outputs of IO register #06A1 and IO register #1A65 which are provided for bank A11, and transfers these outputs to output buffer 17. This multiplexer 15 operates in synchronization with internal clock signal ICLK (f) having a frequency f. Multiplexer 15 selects a bank according to bank address signal BA. Here, bank A11 is selected. Then, switching between IO register #0A61 and IO register #1A65 is performed by signals #0 and #1.

Thus, in the SDRAM according to the present embodiment, two column address counters can be employed for one bank. Accordingly, two different reference internal column address signals can be allocated to the two column address counters, respectively.

As a result, when access is to be made alternately within one bank according to internal column address signals based on different reference internal column address signals, respectively, it is not necessary to input an external column address signal upon every access. In other words, address input can be simplified in the present embodiment even when access is to be made alternately according to two different reference internal column address signals.

It may be noted that the operation of FIG. 9 corresponds to the operation of FIG. 2. The main difference between them consists in that although two banks are accessed alternately in the operation of FIG. 2, one single bank is being accessed alternately in the operation of FIG. 9.

In addition, although description has been made for the readout operation in FIG. 9, it is also possible to perform a readout operation to reference internal column address signal Ya and write operation to reference internal column address signal YA alternately as in FIG. 4. An effect similar to the one described above can be obtained in this case also.

Figure 10:
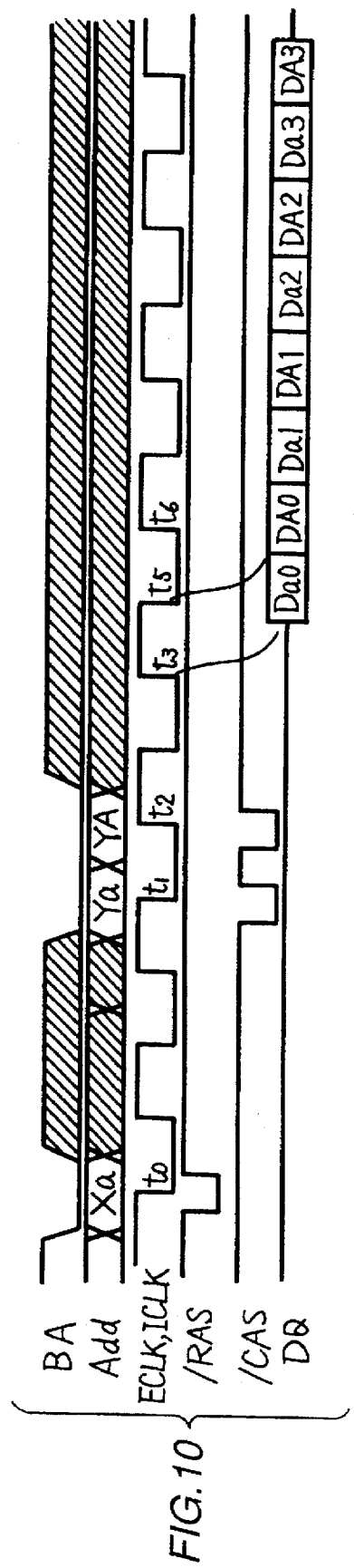

FIG. 10 is a timing chart for illustrating the second operation of the SDRAM of FIG. 8. In the second operation, a column address signal Ya is incorporated at the fall of external clock signal ECLK with a frequency f while reference internal column address signal YA is incorporated at the rise of the clock signal, and upon every edge of this external clock signal ECLK, data for reference internal column address signals Ya and YA are output alternately.

As in the case of the above-described first operation, column address counter A5 and column address counter B7 are employed for bank A11, and access is made alternately within bank A11.

Referring to FIG. 10, row address signal Xa and /RAS are incorporated at the falling edge of external clock signal ECLK at time $t_0$. At time $t_1$, column address signal Ya and /CAS are incorporated at the falling edge of external clock signal ECLK. At time $t_2$, column address signal YA and /CAS are incorporated at the rising edge of external clock signal ECLK.

Then, output of data for reference internal column address signal Ya starts from time $t_3$. The output is determined before time $t_5$.

Output of data DA0 for reference internal column address signal YA starts from the falling edge at time $t_5$, and it is determined before the rising edge at time $t_6$. The time period between time $t_0$ and the time when data Da0 is output from the rising edge of external clock signal ECLK at time $t_3$ satisfies /RAS access time.

Thereafter, data (Da1, Da2, Da3) corresponding to internal column address signal according to reference internal column address signal Ya and data (DA1, DA2, DA3) corresponding to the internal column address signal according to reference internal column address signal YA are output alternately.

This is based upon the fact that column address counter A5 and column address counter B7 generate internal column address signals according to reference internal column address signal Ya and reference internal column address signal YA, respectively, in synchronization with internal clock signal ICLK (f) with frequency f, successively and alternately.

In addition, column address counter A5 generates the internal column address signal in response to the falling edge of internal clock signal ICLK (f). Column address counter B7 generates the internal column address signal in response to the rising edge of internal clock signal ICLK (f). It may be noted that the operation of FIG. 10 corresponds to the operation of FIG. 6. The main difference between them is that two banks are being accessed alternately by the operation of FIG. 6 while one single bank is being accessed alternately by the operation of FIG. 10.

In addition, multiplexer 15 was in synchronization with internal clock signal ICLK (f) of frequency f in the first operation, but it is in synchronization with internal clock signal ICLK (2f) of frequency 2f in the second operation. The rest of the operation is similar to the case of the first operation.

Thus, also in the case in which the SDRAM according to the present embodiment performs the second operation, input of external column address signal upon every access is not required for the reason similar to the one given in the description of the first operation, and it is possible to simplify the address input.

Although description has been made for readout operation in FIG. 10, it is also possible to perform a readout operation for reference internal column address signal Ya and write operation for reference internal column address signal YA alternately as in FIG. 7. An effect similar to the effect described above can be obtained in this case also.

In addition, although there were two banks in FIG. 8, an effect similar to the effect described above can be obtained with a case in which there are a plurality of banks, namely more than two banks, by providing a plurality of column address counters to the plurality of banks so that application is made possible in a similar manner as described above.

In addition, it is also possible to perform a switching so that output of column address counter A5 is input to column decoder A33 of bank A11 and output of column address counter B7 is input to column decoder B35 of bank B13. In this case, operation as shown in Embodiments 1 and 2 can also be implemented, and an effect similar to the effect of Embodiments 1 and 2 is obtained.

Embodiment 4

In the SDRAMs according to Embodiments 1 to 3, two column address counters were provided corresponding to two banks, but in an SDRAM according to Embodiment 4, one column address counter having a function of two column address counters is provided for the two banks.

Figure 11:
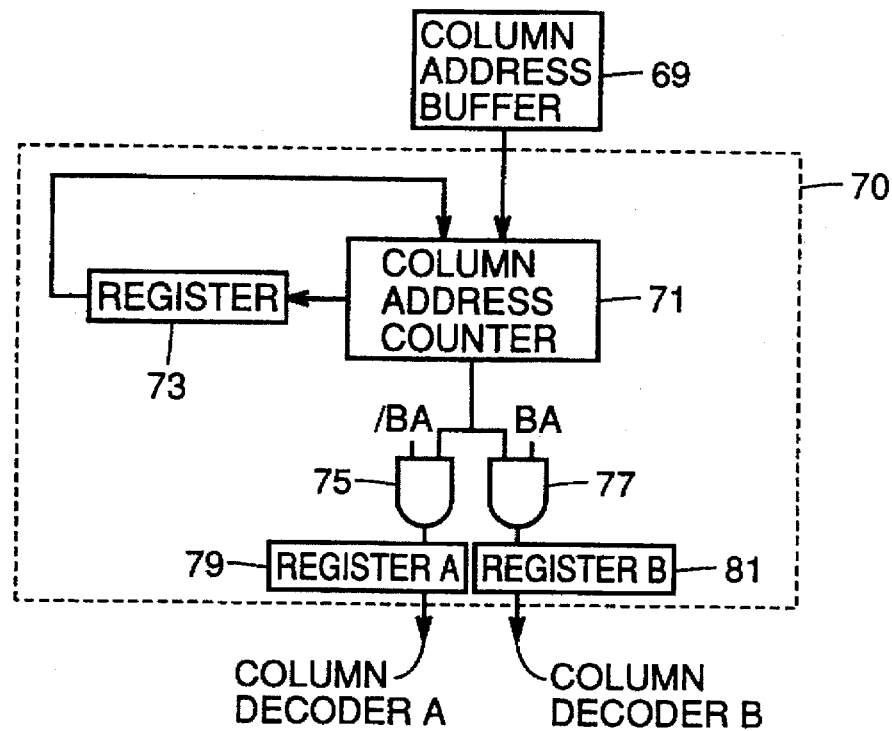
FIG. 11 is a schematic block diagram showing a portion of an SDRAM according to Embodiment 4 of the present invention, related to generation of internal column address signals.

FIG. 11 is a schematic block diagram showing a portion related to generation of internal column address signals in the SDRAM according to Embodiment 4 of the present invention.

Referring to FIG. 11, the portion related to generation of internal column address signals includes a column address buffer 69 and a column address counter portion 70. Column address counter portion 70 includes a column address counter 71, a register 73, an AND circuit A75, an AND circuit B77, a register A79 and a register B81.

Consideration is made for the case in which column address buffer 69 and column address counter portion 70 of FIG. 11 are applied to the circuitry of FIG. 1. Instead of column address buffer A25 and column address buffer B27 of FIG. 1, column address buffer 69 is provided in the present embodiment.

Instead of column address counter A5 and column address counter B7 of FIG. 1, column address counter portion 70 is provided in the present embodiment. In the following, description will be based upon an assumption that column address buffer 69 and column address counter portion 70 are provided in the SDRAM of FIG. 1.

When bank A11 is in operation, bank address signal BA would be at "L" level and AND circuit B77 would be inactivated. Meanwhile, AND circuit A75 is activated when bank address signal BA is at "L" level. This is because AND circuit A75 receives a signal /BA which is an inverted signal of bank address signal BA. Accordingly, output of column address counter 71 is input to column decoder A33 of bank A11.

Then, when it is attempted to make an access to bank B13 during the time in which operation is being made to bank A11, the output from column address counter 71 which has been input to bank A11 is held temporarily in register 73. That is, the internal column address signal to bank A11 from column address counter 71 would be held in register 73.

Then, column address counter 71 performs an operation to bank B13. At this time, since bank address signal BA is at "H" level, AND circuit 75 is inactivated. Meanwhile, since bank address signal BA is at "H" level, AND circuit 77 is activated. Accordingly, the output from column address counter 71 is input to column decoder B35 of bank B13.

Then, when the switching is made to bank A11, the internal column address signal of bank A11 held in register 73 is input to column address counter 71 as a reference internal column address signal. At the same time, the output of column address counter 71 to bank B13 would be held in register 73.

Column address counter 71 successively generates internal column address signals to bank A11 or bank B13 according to reference internal column address signal to bank A11 or bank B13.

At has been described above, column address counter portion 70 employed in the SDRAM according to the present embodiment causes the register to hold the internal column address signals to which access is completed, upon every change of the bank to be accessed. When there is a requirement for an access, register 73 inputs the internal column address signal held therein to column address counter 71 as the reference internal column address signal.

As a result, in the present embodiment, it is not necessary to input an external column address signal to the bank to be accessed upon every change of the bank to be accessed, so that address input can be simplified.

In addition, although two column address counters were provided corresponding to the two banks in Embodiments 1 to 3, one column address counter portion 71 having a function of two column address counters is provided for the two banks in the present embodiment. Accordingly, the scale of the circuit can be made smaller as compared to the case in which two column address counters were provided corresponding to the two banks.

Similarly, column address buffer 69 and column address counter portion 70 can also be provided to the SDRAMs of FIGS. 5 and 8. An effect similar to the effect as described above would be obtained in this case also.

In the case in which there are a plurality of banks provided, column address buffer 69 and column address counter portion 70 of FIG. 11 can be applied similarly. An effect as described above can be obtained in this case also.

Embodiment 5

Although there has been two row address buffers provided for the two banks in Embodiments 1 to 4, an SDRAM according to the present embodiment employs one row address buffer for two banks.

Figure 12:
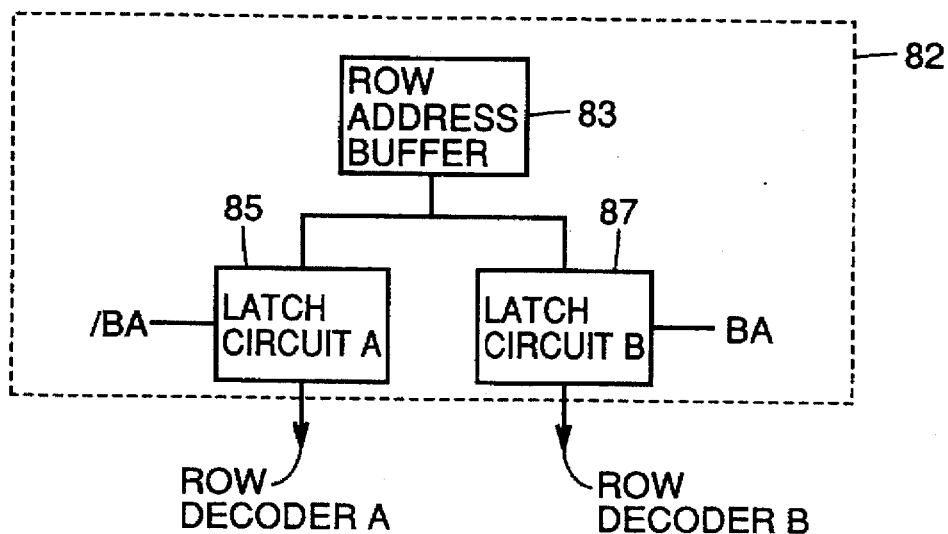
FIG. 12 is a schematic block diagram showing a row address buffer portion employed in an SDRAM according to Embodiment 5 of the present invention.

FIG. 12 is a schematic block diagram showing a row address buffer portion employed in the SDRAM according to Embodiment 5.

Referring to FIG. 12, a row address buffer portion 82 includes a row address buffer 83, a latch circuit A85 and a latch circuit B87. Here, description will be made for the case in which row address buffer portion 82 of FIG. 12 is employed in the SDRAM of FIG. 1.

More specifically, row address buffer portion 82 is employed in place of row address buffer A21 and row address buffer B23 in FIG. 1. In the following, description will be made on the assumption that row address buffer portion 82 of FIG. 12 is provided in the SDRAM of FIG. 1.

Row address buffer 83 receives an external row address signal. Latch circuit A85 latches the row address signal from row address buffer 83 by signal /BA which is an inversion of bank address signal BA at "L" level indicating bank A11. To a row decoder A29 of bank A11, an internal row address signal is input.

Meanwhile, latch circuit B87 latches the row address signal from row address buffer 83 by bank address signal BA at "H" level indicating bank B13. An internal row address signal is input to row decoder B31 of bank B13.

Thus, in the SDRAM according to the present embodiment, one row address buffer portion having a function similar to that of two row address buffers is employed for the two banks. Accordingly, scale of the circuit can be reduced in the present embodiment as compared to the case in which two row address buffers are provided for the two banks. In addition, since the present embodiment is based on the SDRAM of FIG. 1, an effect similar to that of Embodiment 1 is also obtained.

Although row address buffer portion 82 of FIG. 12 has been employed for the SDRAM of FIG. 1 in the above description, it may also be used for the SDRAMs of FIGS. 5 and 8 in a similar manner. This also provides an effect similar to the effect described above.

In addition, although the above described has been made for one row address buffer portion having a function similar to that of two row address buffers, one column address buffer portion having a function similar to that of two column address buffers can also be formed in a similar manner as that of the row address buffer portion shown in FIG. 12.

More particularly, this is done by employing a column address buffer instead of row address buffer 83 in FIG. 12. The one column address buffer portion formed in this way can be used in the SDRAMs according to Embodiments 1 to 4. An effect similar to the effect described above is obtained in this case also. Application to the case in which the above-described row address buffer portion 82 and the column address buffer portion are employed for a plurality of banks, namely more than two banks, can be done by increasing the number of latch circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device, comprising:

an internal clock signal generating means for generating an internal clock signal in response to an external clock signal;

a plurality of memory array banks each having a plurality of memory cells for storing information;

a row address buffer for receiving a plurality of external row address signals for selecting a corresponding row of corresponding memory array bank and for generating a plurality of internal row address signals in response to said plurality of external row address signals;

a column address buffer for receiving a plurality of external column address signals for selecting a corresponding column of corresponding memory array bank and for generating a plurality of reference internal column address signals in response to said plurality of external column address signals; and a plurality of address counter means each generating successively internal column address signals for selecting the columns of said memory array bank in response to said reference internal column address signal from said column address buffer in synchronization with said internal clock signals during normal access of said memory array bank, wherein a plurality of said address counter means are provided so that a plurality of said reference internal column address signals can be allocated thereto, so that, upon every time an access is performed, input of said external column address signal corresponding to that access is not required, said plurality of address counter means are employed for one of said memory array banks and generate alternately said plurality of internal column address signals in response to said plurality of reference internal column address signals to said plurality of memory array bank, and access to the synchronous semiconductor memory device for an operation of continuously outputting or continuously inputting one or more data with one column address of one memory array bank as a start address is combined with the operation of continuously outputting or continuously inputting one or more data with one column address of another memory array bank as a start address.

2. The synchronous semiconductor memory device according to claim 1, wherein two said memory array banks and two said address counter means are provided, said row address buffer receives and transfers said external row address signal to said memory array bank in response to one determined transition of the rise and fall of said external clock signal, said column address buffer then receives and transfers two said external column address signals to said two memory array banks with different timings in response to one determined transition of said external clock signal as in the case in which said external row address signal is received and transferred to said memory array bank, and said two address counter means alternately generate two said internal column address signals in response to two said reference internal column address signals to said two memory array banks in synchronization with said internal clock signal having a frequency of one half of the frequency of said external clock signal.

3. The synchronous semiconductor memory device according to claim 1, wherein two said memory array banks and two said address counter means are provided, said row address buffer receives and transfers said external row address signal for one of said two memory array banks in response to determined one transition of the rise and fall of said external clock signal and receives and transfers said external row address signal for the other one of said two memory banks in response to the other determined transition of said external clock signal, said column address buffer then receives and transfers said external column address signal for one said memory array bank in response to one determined transition of said external clock signal as in the case in which said external row address signal for said one memory array bank is received and transferred, and receives and transfers said external column address signal for said the other memory array bank in response to the other determined transition of said external clock signal as in the case in which said external row address signal for the other said memory array bank is received and transferred, said two address counter means alternately generate two said internal column address signals in response to two said reference internal column address signals to said two memory array banks in synchronization with said internal clock signal having the same frequency as that of said external clock signal.

4. The synchronous semiconductor memory device according to claim 1, wherein said row address buffer includes a row buffer for receiving said plurality of external row address signals and generating said plurality of internal row address signals; and a bank selecting means for selecting said memory array bank which requires said internal row address signal from said row buffer.

5. The synchronous semiconductor memory device according to claim 1, wherein said column address buffer includes a column buffer for receiving said plurality of external column address signals and generating said plurality of reference internal column address signals; and a bank selecting means for selecting said memory array bank which requires said reference internal address signal from said column buffer.

6. A synchronous semiconductor memory device, comprising:

an internal clock signal generating means for generating an internal clock signal in response to an external clock signal;

a plurality of memory array banks each having a plurality of memory cells for storing information;

a row address buffer for receiving a plurality of external row address signals for selecting a corresponding row of corresponding memory array bank and for generating a plurality of internal row address signals in response to said plurality of external row address signals;

a column address buffer for receiving a plurality of external column address signals for selecting a corresponding column of corresponding memory array bank and for generating a plurality of reference internal column address signals in response to said plurality of external column address signals; and a plurality of address counter means each generating successively internal column address signals for selecting the columns of said memory array bank in response to said reference internal column address signal from said column address buffer in synchronization with said internal clock signals during normal access of said memory array bank, wherein a plurality of said address counter means are provided so that a plurality of said reference internal column address signals can be allocated thereto, so that, upon every time an access is performed, input of said external column address signal corresponding to that access is not required, said plurality of address counter means are employed for one of said memory array banks, receives said plurality of reference internal column address signals to said one memory array bank and generate alternately the plurality of said internal column address signals in response to said plurality of reference internal column address signals to said one memory array bank, and access to the synchronous semiconductor memory device for an operation of continuously outputting or continuously inputting one or more data with one column address of one memory array bank as a start address is combined with the operation of continuously outputting or continuously inputting one or more data with another column address of the same memory array bank as a start address.

7. The synchronous semiconductor memory device according to claim 6, wherein two said memory array banks and two said address counter means are provided, said row address buffer receives and transfers said external row address signal for one of said two memory array banks in response to one determined transition of the rise and fall of said external clock signal, said column address buffer then receives and transfers two said external column address signals for one said memory array bank with different timings in response to one determined transition of said external clock signal as in the case in which said external row address signal is is received and transferred for said one of said two memory array banks, said two address counter means alternately generate two said internal column address signals in response to two said reference internal column address signals for one said memory array bank in synchronization with said internal clock signal having a frequency of one half of the frequency of said external clock signal.

8. The synchronous semiconductor memory device according to claim 6, wherein two said memory array banks and two said address counter means are provided, said row address buffer receives and transfers one said external row address signal for one memory array bank of said two memory array banks in response to one determined transition of the rise and fall of said external clock signal and receives and transfers the other said external row address signal for said one memory array bank in response to the other determined transition of said external clock signal, said column address buffer then receives and transfers one said external column address signal for one said external row address signal in response to one determined transition of said external clock signal as in the case in which one said external row address signal is received and transferred for said one memory array bank and receives and transfers the other said external column address signal for the other said external row address signal in response to the other determined transition of said external clock signal as in the case in which said the other external row address signal is received and transferred for said one memory array bank, said two address counter means alternately generate two said internal column address signals in response to two said reference internal column address signals to said one memory array bank in synchronization with said internal clock signal having the same frequency as that of said external clock signal.

9. The synchronous semiconductor memory device according to claim 6, wherein said row address buffer includes a row buffer for receiving said plurality of external row address signals and generating said plurality of internal row address signals; and a bank selecting means for selecting said memory array bank which requires said internal row address signal from said row buffer.

10. The synchronous semiconductor memory device according to claim 6, wherein said row address buffer includes a row buffer for receiving said plurality of external row address signals and generating said plurality of internal row address signals; and a bank selecting means for selecting said memory array bank which requires said internal row address signal from said row buffer.

11. A synchronous semiconductor memory device, comprising:

an internal clock signal generating means for generating an internal clock signal in response to an external clock signal;

a plurality of memory array banks each having a plurality of memory cells for storing information;

a row address buffer for receiving a plurality of external row address signals for selecting a corresponding row of corresponding memory array bank to generate a plurality of internal row address signals in response to said external row address signals;

a column address buffer for receiving a plurality of external column address signals for selecting a corresponding column of corresponding memory array bank and for generating a plurality of reference internal column address signals in response to said external column address signals; and an address counter means for successively generating internal column address signals for selecting columns of said memory array bank in synchronization with said internal clock signal in response to said reference internal column address signal from said column address buffer during normal access of said memory array bank, wherein said address counter means includes a counter for successively generating said internal column address signals in response to said reference internal column address signal, an internal column address signal holding means for holding said internal column address signal after an operation of said counter for said reference internal column address signal and for outputting said held internal column address signal to said counter as a new reference internal column address signal after an operation of said counter for other one of said reference internal column address signals which are not the base of the held internal column address signal, and a selecting means for outputting said internal column address signal from said counter to the side of said memory array bank which is to select a column by said internal column address signal from said counter, said internal column address signal holding means holding said internal column address signal in response to said reference internal column address signal which is not related to an access, and outputting that held said internal column address signal as a new said reference internal column address signal to said counter when there is a requirement for an access, such that it is not necessary to input upon every access said reference internal column signal corresponding to that access, said counter alternately generates a plurality of said internal column address signals in response to a plurality of said reference internal column address signals from said column address buffer to said plurality of memory array banks, and access to the synchronous semiconductor memory device for an operation of continuously outputting or continuously inputting one or more data with one column address of one memory array bank as a start address is combined with the operation of continuously outputting or continuously inputting one or more data with one column address of another memory array bank as a start address.

12. The synchronous semiconductor memory device according to claim 11, wherein two said memory array banks are provided, said row address buffer receives and transfers said external row address signal for said memory array bank in response to one determined transition of the rise and fall of said external clock signal, said column address buffer then receives and transfers two said external column address signals for said two memory array banks with different timings in response to one determined transition of said external clock signal as in the case in which said external row address signal is received and transferred for said memory array bank, said address counter means alternately generates two said internal column address signals in response to two said reference internal column address signals from said column address buffer to said two memory array banks in synchronization with said internal clock signal having a frequency of one half of the frequency of said external clock signal.

13. The synchronous semiconductor memory device according to claim 11, wherein two said memory array banks are provided, said row address buffer receives and transfers said external row address signal to one of said two memory array banks in response to one determined transition of the rise and fall of said external clock signal and receives and transfers said external row address signal to the other one of said two memory array banks in response to the other determined transition of said external clock signal, said column address buffer then receives and transfers said external column address signal to said one memory array bank in response to one determined transition of said external clock signal as in the case in which said external row address signal to said one memory array bank is received and transferred and receives and transfers said external row address signal to the other said memory array bank in response to the other determined transition of said external clock signal as in the case in which said external row address signal to said the other memory array bank is received and transferred, and said address counter means alternately generates two said internal column address signals in response to two said reference internal column address signals from said column address buffer to two said memory array banks in synchronization with said internal clock signal having the same frequency as that of said external clock signal.

14. The synchronous semiconductor memory device according to claim 11, wherein said row address buffer includes a row buffer for receiving said plurality of external row address signals and generating said plurality of internal row address signals; and a bank selecting means for selecting said memory array bank which requires said internal row address signal from said row buffer.

15. A synchronous semiconductor memory device, comprising:

an internal clock signal generating means for generating an internal clock signal in response to an external clock signal;

a plurality of memory array banks each having a plurality of memory cells for storing information;

a row address buffer for receiving a plurality of external row address signals for selecting a corresponding row of corresponding memory array bank to generate a plurality of internal row address signals in response to said external row address signals;

a column address buffer for receiving a plurality of external column address signals for selecting a corresponding column of corresponding memory array bank and for generating a plurality of reference internal column address signals in response to said external column address signals; and an address counter means for successively generating internal column address signals for selecting columns of said memory array bank in synchronization with said internal clock signal in response to said reference internal column address signal from said column address buffer during normal access of said memory array bank, wherein said address counter means includes a counter for successively generating said internal column address signals in response to said reference internal column address signal, an internal column address signal holding means for holding said internal column address signal after an operation of said counter for said reference internal column address signal and for outputting said held internal column address signal to said counter as a new reference internal column address signal after an operation of said counter for other one of said reference internal column address signals which are not the base of the held internal column address signal, and a selecting means for outputting said internal column address signal from said counter to the side of said memory array bank which is to select a column by said internal column address signal from said counter, said internal column address signal holding means holding said internal column address signal in response to said reference internal column address signal which is not related to an access, and outputting that held said internal column address signal as a new said reference internal column address signal to said counter when there is a requirement for an access, such that it is not necessary to input upon every access said reference internal column signal corresponding to that access, said counter alternately generates a plurality of said internal column address signals in response to a plurality of said reference column internal address signals for one memory bank of said plurality of memory array banks to said one memory array bank, and access to the synchronous semiconductor memory device for an operation of continuously outputting or continuously inputting one or more data with one column address of one memory array bank as a start address is combined with the operation of continuously outputting or continuously inputting one or more data with another column address of the same memory array bank as a start address.

16. The synchronous semiconductor memory device according to claim 15, wherein two said memory array banks are provided, said row address buffer receives and transfers said external row address signal to one memory array bank of the said two memory array banks in response to one determined transition of the rise and fall of said external clock signal, said column address buffer then receives and transfers two said external column address signals to said one memory array bank with different timings in response to one determined transition of said external clock signal as in the case in which said external row address signal is received and transferred to said one memory array, and said address counter means alternately generates two said internal column address signals in response to two said reference internal column address signals from said column address buffer to said one memory array bank in synchronization with said internal clock signal having a frequency of one half of the frequency of said external clock signal.

17. The synchronous semiconductor memory device according to claim 15, wherein two said memory array banks are provided, said row address buffer receives and transfers one said external row address signal to one memory array bank of said two memory array banks in response to one determined transition of the rise and fall of said external clock signal and receives and transfers the other said external row address signal to said one memory array bank in response to the other determined transition of said external clock signal, said column address buffer then receives and transfers one said external column address signal to said one external row address signal in response to one determined transition of said external clock signal as in the case in which said one external row address signal is is received and transferred to said one memory array bank and receives and transfers the other said external column address signal for the other said external row address signal in response to the other determined transition of said external clock signal as in the case in which said the other external row address signal is is received and transferred to said one memory array bank, and said address counter means alternately generates two said internal column address signals in response to two said reference internal column address signals from said column address buffer for said one memory array bank in synchronization with said internal clock signal having the same frequency as that of said external clock signal.

18. The synchronous semiconductor memory device according to claim 15, wherein said column address buffer includes a column buffer for receiving said plurality of external column address signals and generating said plurality of reference internal column address signals; and a bank selecting means for selecting said memory array bank which requires said reference internal address signal from said column buffer.

* * * * *